United States Patent
Benwadih et al.

(10) Patent No.: US 8,748,872 B2
(45) Date of Patent: Jun. 10, 2014

(54) ORGANIC TRANSISTOR AND METHOD FOR FABRICATING A DIELECTRIC LAYER OF SUCH A TRANSISTOR

(75) Inventors: Mohamed Benwadih, Champigny-sur-Marne (FR); Christophe Serbutoviez, Voiron (FR)

(73) Assignee: Commissariat à l'Energie Atomique, Paris (FR)

(*) Notice: Subject to any disclaimer, the term of this patent is extended or adjusted under 35 U.S.C. 154(b) by 1209 days.

(21) Appl. No.: 12/490,816

(22) Filed: Jun. 24, 2009

(65) Prior Publication Data

US 2010/0025668 A1 Feb. 4, 2010

(30) Foreign Application Priority Data

Jul. 31, 2008 (FR) ...................... 08 55300

(51) Int. Cl.
*H01L 29/08* (2006.01)
(52) U.S. Cl.
USPC ..................................... 257/40; 257/E51.007
(58) Field of Classification Search
USPC ............. 257/40, E51.006, E51.007; 977/773, 977/779
See application file for complete search history.

(56) References Cited

U.S. PATENT DOCUMENTS

| 7,692,185 B2 * | 4/2010 | Suh et al. ....................... 257/40 |
| 2005/0285102 A1 | 12/2005 | Koo et al. |
| 2007/0215957 A1 | 9/2007 | Chen et al. |
| 2007/0254402 A1 * | 11/2007 | Dimmler et al. ................ 438/99 |
| 2009/0038683 A1 | 2/2009 | Walter et al. |

FOREIGN PATENT DOCUMENTS

WO WO-2007/074404 A2 7/2007

OTHER PUBLICATIONS

Dielectric Constant of Selected Polymers, XP-002518007 (p. 13-13).
H.P.R. Frederikse, Permittivity (Dielectric Constant) of Inorganic Solids, XP-002518008, pp. 12-44 to 12-52.
Republique Francaise, Rapport De Recherche Preliminaire, dated Mar. 6, 2009, 2 pgs. in French language.

* cited by examiner

*Primary Examiner* — Cuong Q Nguyen
*Assistant Examiner* — Yosef Gebreyesus

(57) ABSTRACT

The present invention relates to an organic transistor comprising a conductive element which forms a drain; a conductive element which forms a source located away from the drain; a conductive element which forms a gate having a surface which faces the drain and a surface which faces the source; a semiconducting layer which is in contact with the drain and the source; and a dielectric layer located between, firstly, the gate and, secondly, the source and the drain with the dielectric layer having a dielectric permittivity which varies depending on its thickness. According to the invention, the dielectric layer comprises a layer of a first dielectric material having a dielectric permittivity of less than four in which there is formed, at least between said opposite-facing surfaces, a volume of a second material, said volume having an overall cross-section which tapers from gate towards the space between drain and source and in that the relative dielectric permittivity of the second material exceeds four.

11 Claims, 4 Drawing Sheets

ORGANIC TRANSISTOR AND METHOD FOR FABRICATING A DIELECTRIC LAYER OF SUCH A TRANSISTOR

CROSS REFERENCE TO RELATED APPLICATION

This application claims priority under 35 U.S.C. §119 from French Patent Application No. 0855300 filed on Jul. 31, 2008 in the French Patent Office, the entire disclosure of which is incorporated herein by reference.

FIELD OF THE INVENTION

The present invention relates to the field of organic transistors such as, for example, thin-film transistors commonly referred to as Organic Thin-Film Transistors (OTFTs).

DESCRIPTION OF THE PRIOR ART

FIG. 1 shows a thin-film organic transistor 10 according to the prior art which has a top-gate, bottom-contact (TGBC) architecture.

Transistor 10 comprises a substrate 12 on which two conductive elements 14, 16 which constitute the drain and the source of transistor 10 respectively are formed. A semiconducting layer 18 is placed on drain 14 and source 16 with semiconducting layer 18 itself being covered by a dielectric layer 20 on which a third conductive element 22 which constitutes the gate of transistor 10 is formed.

In a manner which is known in itself, the transistor effect is obtained by applying a voltage across gate 22 and the substrate 12 so as to produce, in semiconducting layer 18, a charge-carrier channel 23 between drain 14 and source 16. In order to obtain a channel 23 which is bound to extend from drain 14 to source 16, gate 22 partially overlaps the latter. Thus, gate 22 has a surface 24 which faces surface 26 of drain 14 and a surface 28 which faces surface 30 of source 16.

However, two conductors having opposite-facing surfaces separated by a dielectric layer form a capacitor. It is thus observed that there is stray capacitance between, firstly, gate 22 and drain 14 and, secondly, between gate 22 and source 16 because of opposite-facing surfaces 24 and 26 and opposite-facing surfaces 28 and 30.

In order to reduce such stray capacitance, dielectric layer 20 may consist of a dielectric with a low relative electrical permittivity or a "low-k dielectric" characterized by relative permittivity values of less than 4.

However, as the relative electrical permittivity of a material decreases, the more difficult it becomes to polarize. In fact, the reduced permittivity of dielectric layer 20 is accompanied by an increase in the supply voltage needed between gate 22 and substrate 12 in order to create the charge-carrier channel between drain 14 and source 16.

Increasing the supply voltage, however, poses problems of cost and necessitates transistors which have larger surface areas and are capable of withstanding higher voltages. Realizing large-area organic transistors usually involves using liquid or printing fabrication techniques. These types of techniques are generally efficient with p-type semiconductors but are difficult to use with n-type conductors and this reduces the types of transistors which can be realized right from the very outset.

Another solution is to reduce the thickness of dielectric layer 20 in order to reduce the stray capacitance. However, reducing the thickness of this layer is accompanied, in particular, by increased leakage currents and electrical instability of the transistor.

In addition, modifying the overall properties of dielectric layer 20, especially in order to reduce stray capacitance, also modifies the capacitance of region 32 of dielectric layer 20 located above channel 23. This capacitance must be high, in particular in order to prevent hysteresis phenomena which adversely affect the quality of transistor 10.

In order to overcome some of these drawbacks, a transistor having a semiconducting layer whereof the relative dielectric permittivity varies depending on its thickness has been suggested. This transistor 44 is shown in FIG. 2 and is similar to that described in relation to FIG. 1 apart from the fact that dielectric layer 20 comprises a first sublayer 42 of a dielectric with a high relative dielectric permittivity or "high-k" material on the gate side and a second low-k sublayer 44 of dielectric on the source and drain side.

As is known in itself, a high-k dielectric is characterized by relatively high dielectric permittivity equal to or greater than 4; some high-k materials have a relative dielectric permittivity which can be as high as 100 or even more.

Such a layout makes it possible to reduce the supply voltage of the dielectric and increase the capacitance in region 32 but does not effectively solve the problem of leakage capacitance which still persists.

SUMMARY OF INVENTION

The object of the present invention is to solve the above-mentioned problems by proposing an organic thin-film transistor which allows a high capacitance above the channel and a reduced supply voltage and reduced stray capacitance.

To achieve this, the object of the invention is an organic thin-film transistor comprising:
 a conductive element which forms a drain;
 a conductive element which forms a source located away from the drain;
 a conductive element which forms a gate having a surface which faces the drain and a surface which faces the source;
 a semiconducting layer which is in contact with the drain and the source; and
 a dielectric layer located between, firstly, the gate and, secondly, the source and the drain with the dielectric layer having a dielectric permittivity which varies depending on its thickness, According to the invention the dielectric layer comprises a layer of a first dielectric material having a relative dielectric permittivity of less than four in which there is formed, at least between said opposite-facing surfaces, a volume of a second material. The volume has an overall cross-section which tapers from the gate towards the space between the drain and the source, and the relative dielectric permittivity of the second material exceeds four.

In this document, it is understood that a relative dielectric permittivity is said to be low if it is less than 4 and is said to be high if it exceeds 4.

The term "overall" in this context is taken to mean that the cross-section of the volume close to the gate exceeds the cross-section of the volume close to the region of the semiconducting layer between the drain and the source in which the charge-carrier channel is formed and that the cross-section of the volume may or may not taper monotonically.

In other words, the portion of dielectric between the opposite-facing surfaces of the gate and of the source and the portion of dielectric between the opposite-facing surfaces of the gate and of the drain essentially consist of a dielectric with a low relative dielectric permittivity, thereby reducing stray capacitance. In addition, the portion of dielectric between the gate and the charge-carrier channel formed between the drain and the source essentially sees the dielectric which has a high relative dielectric permittivity value. Because of this, the capacitance of this portion of dielectric is high and this reduces hysteresis phenomena and makes it possible to reduce the voltage between the gate and the substrate which is needed in order to form the charge-carrier channel in the semiconducting layer.

Also, the overall tapering cross-section of the volume of the second material creates a dielectric permittivity gradient in the dielectric layer. This dielectric permittivity gradient makes it possible to improve the performance of the transistor.

In this respect, it should be noted that providing a volume having a constant cross-section above the semiconducting region in which the charge-carrier channel is formed, such as a cylinder of high-k material for example, does not make it possible to produce a transistor which operates satisfactorily because of the absence of such a relative permittivity gradient.

The relative dielectric permittivity of the first material is preferably equal to or less than two and the relative dielectric permittivity of the second material is preferably equal to or greater than eight.

In one particular embodiment of the invention, the volume has a cross-section which tapers monotonically. More especially, the volume is a revolution volume, especially a conical or trapezoidal volume.

In other words, the dielectric permittivity gradient decreases monotonically as a function of the thickness of the dielectric layer and this concentrates the electric field lines in the direction of the charge-carrier channel formed between the drain and the source.

In one particular embodiment of the invention, the dielectric layer comprises a portion of first dielectric material above the space between the drain and the source.

In other words, there is a portion of first dielectric material above the surface of the semiconducting layer and this reduces electrical instability in the transistor.

More especially, the thickness of the portion of first dielectric material is less than 400 nanometers and this makes it possible to obtain a high capacitance above the charge-carrier channel, thus avoiding leakage current and electrical breakdown problems.

In one particular embodiment of the invention the second material is metallic. More especially, the gate is metallic and the volume of the second material is formed all in one piece integrally with the latter.

In one particular embodiment of the invention the second material is a dielectric. In a first variant, the dielectric is preferably alumina $Al_2O_3$. In a second variant, the second material comprises nanocharges having a relative dielectric permittivity greater than four dispersed in an organic matrix having a relative dielectric permittivity of less than four. The nanocharges, which generally have a diameter of approximately 30 to 50 nanometers, preferably have a relative dielectric permittivity in excess of 100 and are nano-sized particles selected from a group consisting of $BaTiO_3$, $Ta_2O_5$, $Al_2O_3$ and $TiO_2$. These nanoparticles have the advantage of having an extremely high relative dielectric permittivity and their nanometric dimensions make it possible to disperse them homogeneously throughout a material having a low relative dielectric permittivity.

In one particular embodiment of the invention the first dielectric material is a fluoropolymer or polystyrene.

The object of the invention is also a method for fabricating a dielectric layer for an organic transistor which has a dielectric permittivity gradient which varies as a function of its thickness, said method consisting of:
 a step to form a layer of a first dielectric material;
 a step to deposit, on the surface of the first material, a mixture of solvent and nanocharges having a relative dielectric permittivity greater than that of the first material; and
 a step to heat the layer of first dielectric material, with evaporation of the solvent by heating and penetration of the nanocharges by absorption into the first dielectric material forming, in the layer of the first material, a volume of a second material having an overall cross-section which tapers as a function of the thickness of the layer of the first material and having a relative dielectric permittivity which is greater than that of the first material.

In other words, this method is specially designed to fabricate the dielectric layer which is part of the structure of the transistor according to the invention.

The object of the invention is also a method for fabricating a dielectric layer for an organic transistor which has a dielectric permittivity gradient which varies as a function of its thickness, said method consisting of:
 a step to form a layer of a first dielectric material;
 a step to etch, in the first dielectric material, a cavity having an overall tapering cross-section; and
 a step to fill said cavity with a second material having a relative dielectric permittivity greater than that of the first material.

In other words, this method is specially designed to fabricate the dielectric layer which is part of the structure of the transistor according to the invention.

BRIEF DESCRIPTION OF THE DRAWINGS

The invention will be made more readily understandable by the following description which relates to the accompanying drawings in which identical references denote identical or analogous components and in which.

DESCRIPTION OF THE PREFERRED EMBODIMENTS

Figure 1:
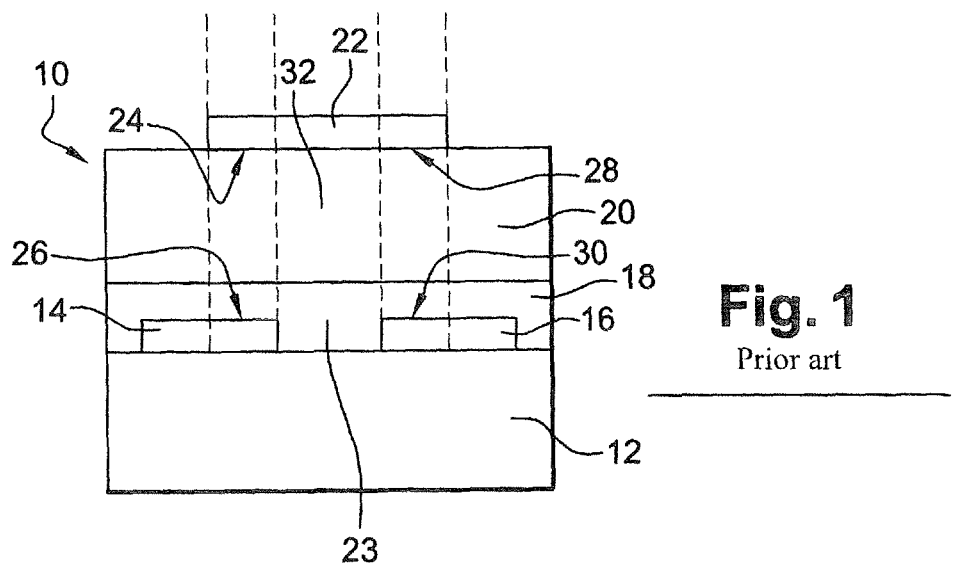
FIG. 1 is a schematic cross-sectional view of a first organic thin-film transistor according to the prior art described in the preamble.
Figure 2:
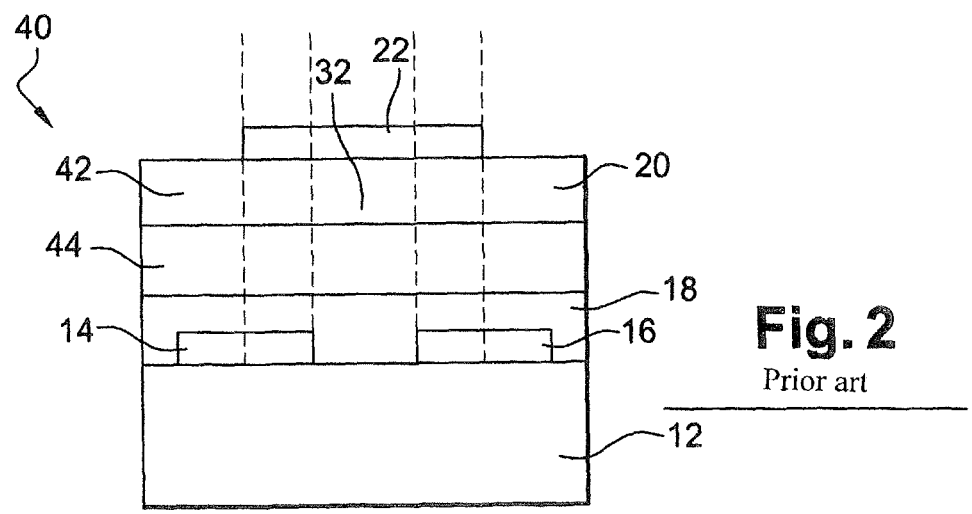
FIG. 2 is a schematic cross-sectional view of a second organic thin-film transistor according to the prior art described in the preamble.
Figure 3:
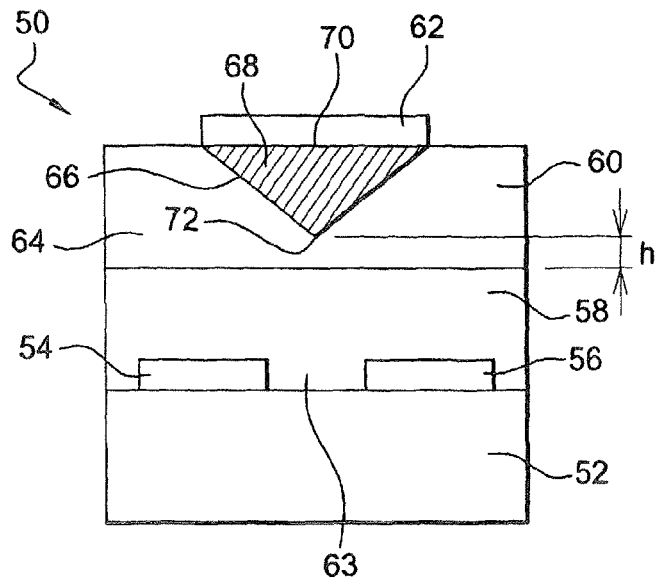
FIG. 3 is a schematic cross-sectional view of an organic thin-film transistor according to a first embodiment of the invention.

FIG. 3 schematically shows an organic thin-film transistor according to a first embodiment of the invention having a "top-gate, bottom-contact" (TGBC) architecture which is referred to in its entirety as 50.

Transistor 50 comprises a substrate 52 on which two conductive elements 54, 56 which constitute the drain and the source of transistor 50 respectively are formed. A semiconducting layer 58 is placed on drain 54 and source 56 with semiconducting layer 58 itself being covered by a dielectric layer 60 on which a third conductive element 62 which constitutes the gate of transistor 50 is formed.

According to the invention, dielectric layer 60 comprises a layer 64 of low-k dielectric, especially a low-k polymer such as a fluoropolymer or a polystyrene, in which a cavity 66 filled with a high-k dielectric is formed.

Cavity 66 formed in low-k dielectric layer 64 which starts underneath gate 22 with large surface 70, has a cross-section which tapers as a function of the thickness of layer 64 with the minimum cross-section 72 of cavity 66 facing portion 63 of semiconductor between drain 54 and source 56 in which the charge-carrier channel is formed. Cavity 66 which is preferably a revolution volume such as a cone, terminates at height h of semiconductor layer 58.

In a first variant, the high-k dielectric is alumina $Al_2O_3$.

In a second variant, high-k dielectric 68 which fills cavity 66 advantageously comprises high-k nanocharges having a diameter of approximately 30 to 50 nanometers and preferably a relative dielectric permittivity in excess of 100 dispersed in an organic matrix, such as the low-k polymer of layer 64 for example, having a density equal to or greater than 6.08 g/ml. The nanocharges are nanoparticles of $BaTiO_3$, $Ta_2O_5$, $Al_2O_3$ or $TiO_2$ for example.

Figure 4:
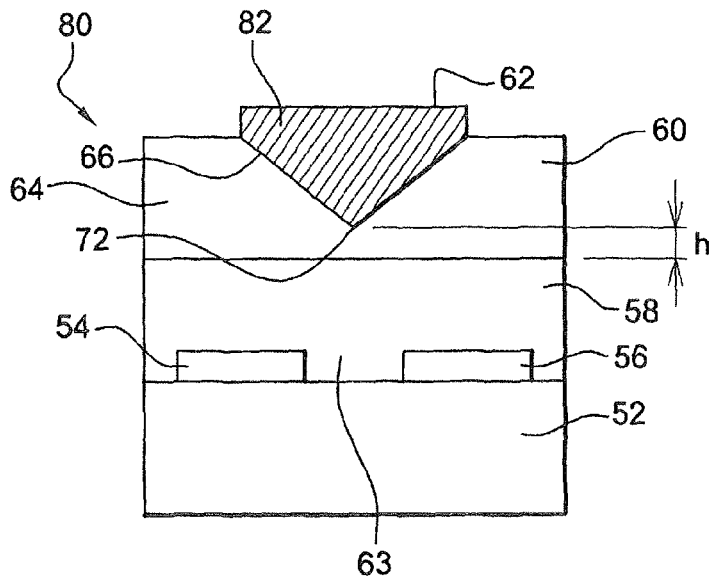
FIG. 4 is a schematic cross-sectional view of an organic thin-film transistor according to a second embodiment of the invention.

FIG. 4 shows a second embodiment of the invention. In this embodiment, transistor 80 is similar to that described in relation to FIG. 3 apart from the fact that cavity 66 formed in low-k dielectric layer 64 is filled with metal 82 which is preferably the same metal as that of which gate 62 is made if the latter is metallic. In this case, the gate and the volume of metal that fills cavity 66 are produced all in one piece and this increases the mechanical strength of the transistor and simplifies its fabrication. Note that the relative dielectric permittivity of a metal exceeds the relative dielectric permittivity of the low-k dielectric of layer 64.

Forming cavity 66 filled with high-k dielectric or metal in low-k dielectric layer 64 produces a relative dielectric permittivity gradient in the thickness of layer 64.

Figure 5:
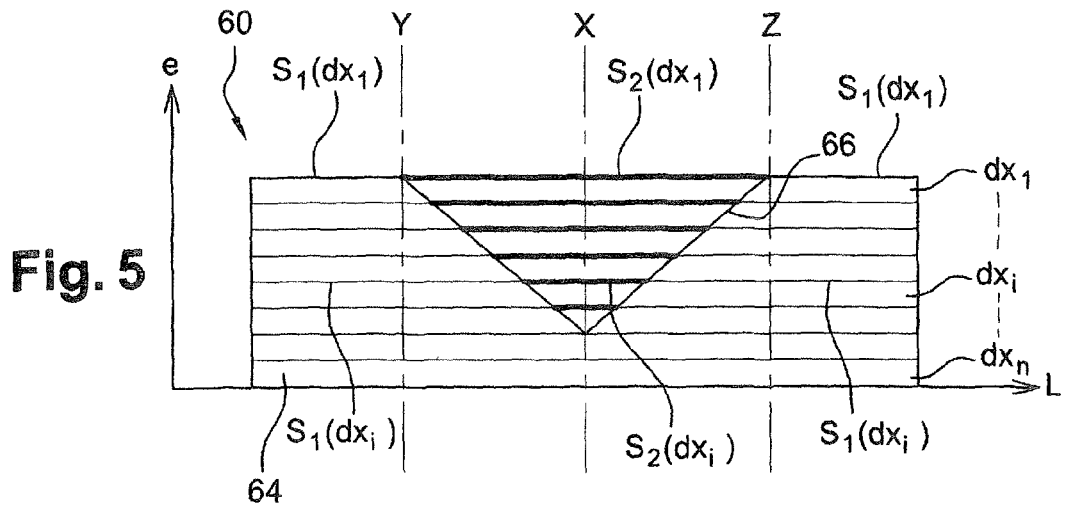
FIG. 5 is a schematic view of the dielectric layer of the transistors in FIGS. 3 and 4 which shows the elementary slices of the dielectric layer.

In fact, as apparent in FIG. 5 which illustrates dielectric layer 60, the relative dielectric permittivity $\varepsilon_r(dx_i)$ of an elementary slice "$dx_i$" of layer 60 equals:

$$\varepsilon_r(dx_i) = S_1(dx_i) \times \varepsilon_{r1} + S_2(dx_i) \times \varepsilon_{r2}$$

where
$S_1(dx_i)$ is the area of the portion of elementary slice "$dx_i$" which corresponds to the low-k dielectric having a relative dielectric permittivity $\varepsilon_{r1}$, and $S_2(dx_i)$ is the area of the portion of elementary slice "$dx_i$" which corresponds to the material that fills cavity 66 (high-k dielectric 68 or metal 82) having a relative dielectric permittivity $\varepsilon_{r2}$.

Figure 6:
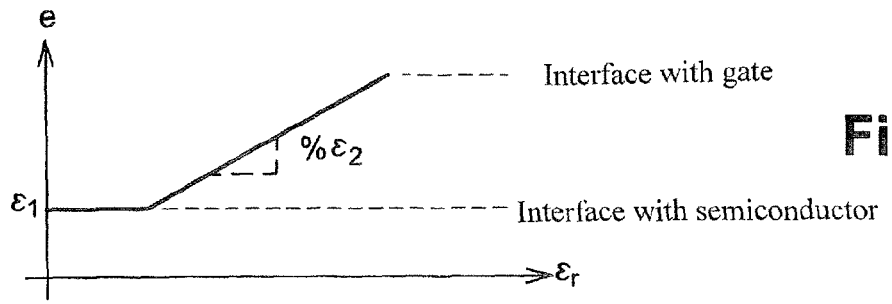
FIG. 6 is a graph showing changes in the relative dielectric permittivity of the semiconducting layer which is part of the structure of the transistors in FIGS. 3 and 4 as a function of the thickness of this layer.

In fact, depending on the thickness e of dielectric layer 60, there is a dielectric permittivity gradient as apparent in FIG. 6. In this Figure the x-axis shows the equivalent relative dielectric permittivity of layer 60 and the y-axis shows its thickness. It should be noted that at the interface with gate 62, the equivalent relative dielectric permittivity of layer 60 is high and equals $\varepsilon_r(dx_1) = S_1(dx_1) \times \varepsilon_{r1} + S_2(dx_1) \times \varepsilon_{r2}$, where $S_1(dx_i)$ is the area of the low-k dielectric and $S_2(dx_i)$ is the area of the material which fills cavity 66 at the level of said interface with gate 62.

The cross-section of cavity 66, in this case a cone, tapers monotonically. The area of the material in cavity 66 in the elementary slices also decreases. The equivalent relative dielectric permittivity of dielectric layer 60 decreases the closer one gets to semiconducting layer 58 and equals the relative dielectric permittivity $\varepsilon_{r1}$ of the low-k dielectric at the interface with semiconducting layer 58.

Such a relative dielectric permittivity gradient has the effect of improving communication between the electric field formed in dielectric layer 60 and gate 62 while increasing the equivalent capacitance of the portion of the dielectric layer located above the charge-carrier channel. The geometry of dielectric layer 60 also makes it possible to have a maximum thickness of low-k dielectric at the level of drain 54 and source 56 in order to minimize the stray capacitance present at the level of the overlapping surfaces between, firstly, gate 62 and drain 64 and, secondly, gate 62 and source 56.

Also, the dielectric permittivity gradient in dielectric layer 60 has the effect of increasing the performance of the transistor by concentrating the electric field lines in the direction of the charge-carrier channel formed between drain 54 and source 56.

Figure 7:
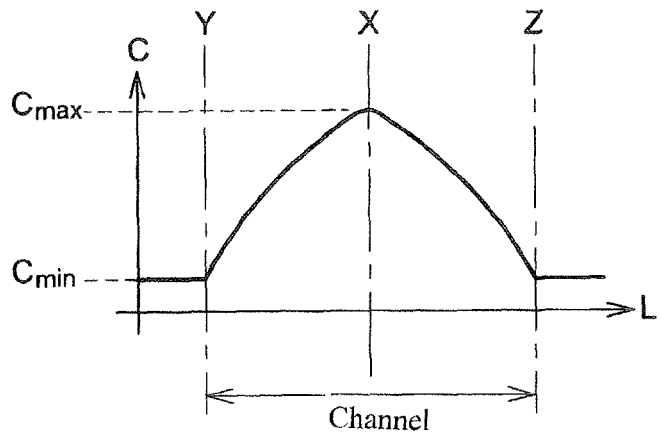
FIG. 7 is a graph showing changes in the capacitance of the semiconducting layer which is part of the structure of the transistors in FIGS. 3 and 4 as a function of the width of this layer.

FIG. 7 shows changes in the equivalent capacitance of dielectric layer 60 as a function of the width L of the latter. The presence of cavity 66 filled with material having a dielectric permittivity greater than that of the low-k dielectric produces an advantageous capacitance profile. According to this profile, the equivalent capacitance of dielectric layer 60 assumes its maximum value at the level of the axis of symmetry X of the cavity, i.e. above portion 63 in which the charge-carrier channel is formed, decreases the farther one moves away from this axis and assumes its minimum value at the level of drain 54 and source 56.

Also, the height h of low-k dielectric present underneath cavity 66 entirely covers semiconducting layer 58 and this reduces dielectric instabilities in the transistor.

It is also apparent that the value of the equivalent capacitance of dielectric layer 60 at the level of the charge-carrier channel depends mainly on the depth (height) of low-k dielectric which covers semiconducting layer 58 and, more especially, is inversely dependent on this height h. A height h of less than 400 nanometers makes it possible, in particular, to achieve a high capacitance between gate 62 and the charge-carrier channel. By way of example, a low-k dielectric having a relative dielectric permittivity equal to 2 makes it possible to obtain a capacitance of approximately 4 nanofarads per $cm^2$. Because this capacitance changes relatively little for height values h in excess of 400 nanometers, choosing a height h which is less than 400 nanometers therefore produces a high-capacitance while avoiding electrical problems such as leakage current or breakdown.

Although a high-k dielectric and a metal each define a relative dielectric permittivity gradient and a variable capacitance when they form a tapering volume in a low-k dielectric layer, a much bigger relative dielectric permittivity gradient is obtained by using a high-k dielectric rather than a metal. Conversely, a greater variation in capacitance is obtained by using a metal rather than a high-k dielectric. The choice of materials used to fill cavity 66 therefore depends on the intended application. For example, if the low-k material is of poor quality, the material that fills cavity 66 is preferably a high-k dielectric such as a high-k ceramic for instance. Conversely, if the low-k material is of good quality, the material that fills cavity 66 may have a relative dielectric permittivity which is not very high and be made of metal.

Obviously, the invention is not confined to the examples described above.

Although a volume having a cross-section which tapers monotonically as a function of the thickness of the low-k dielectric layer is preferred in order to avoid stray overlap capacitance, a permittivity gradient and a variable capacitance are obtained regardless of the shape of the volume as long as the latter has a surface at the interface with the gate which is larger than the opposite-facing surface of the region of semiconducting layer 58 in which the charge-carrier channel is formed. The volume may be trapezoidal or pyramidal, for example. In particular, the choice of cross-section for cavity 66 (circular, square, etc.) may be dictated by the shape of gate 62 if it is decided that cavity 66 will precisely overlap gate 62.

Similarly, a cavity 66 which precisely overlaps gate 62 is described above in relation to FIGS. 3 and 4. In fact, dielectric layer 60 comprises portions of high-k dielectric or metal between the opposite-facing surfaces of gate 62, drain 54 and source 56.

Figure 8:
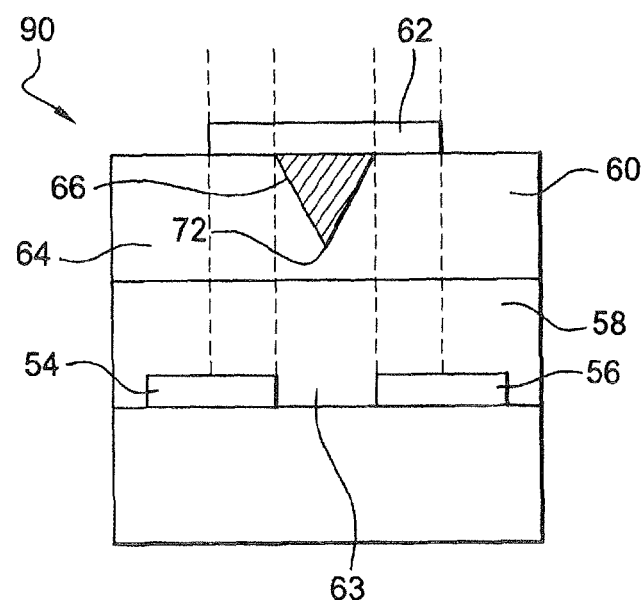
FIG. 8 is a schematic cross-sectional view of an organic thin-film transistor according to a third embodiment of the invention.

Alternatively, as shown in FIG. 8, cavity 66 is formed only in the portion of low-k dielectric above portion 63 of semiconducting layer 58 in which the charge-carrier channel is formed. This reduces stray capacitance even more.

Similarly, transistors which have a top-gate, bottom-contact (TGBC) architecture have been described. Obviously, this invention applies equally to bottom-gate, bottom-contact (BGBC), top-gate, top-contact (TGTC) and bottom-gate, top-contact (BGTC) transistor architectures.

Figure 9:
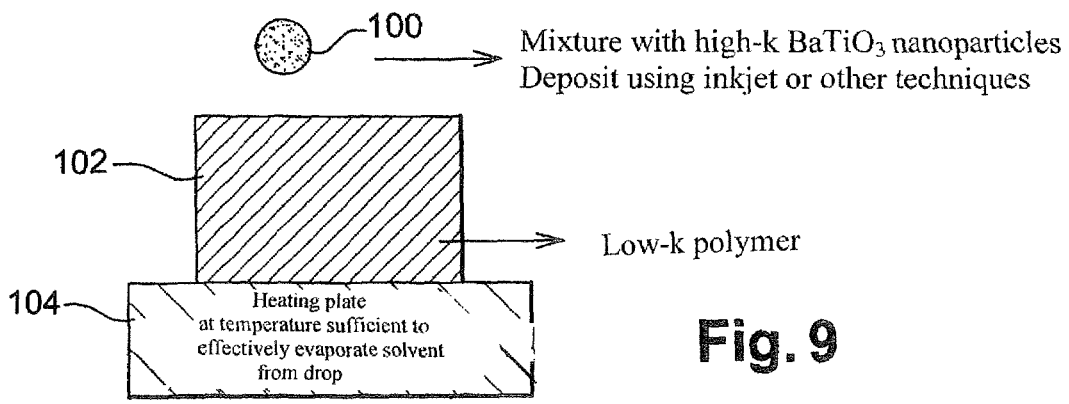
FIGS. 9 to 11 are schematic views showing a fabrication method in accordance with the invention for fabricating the semiconducting layer which is part of the structure of the transistor in FIG. 4.
Figure 10:
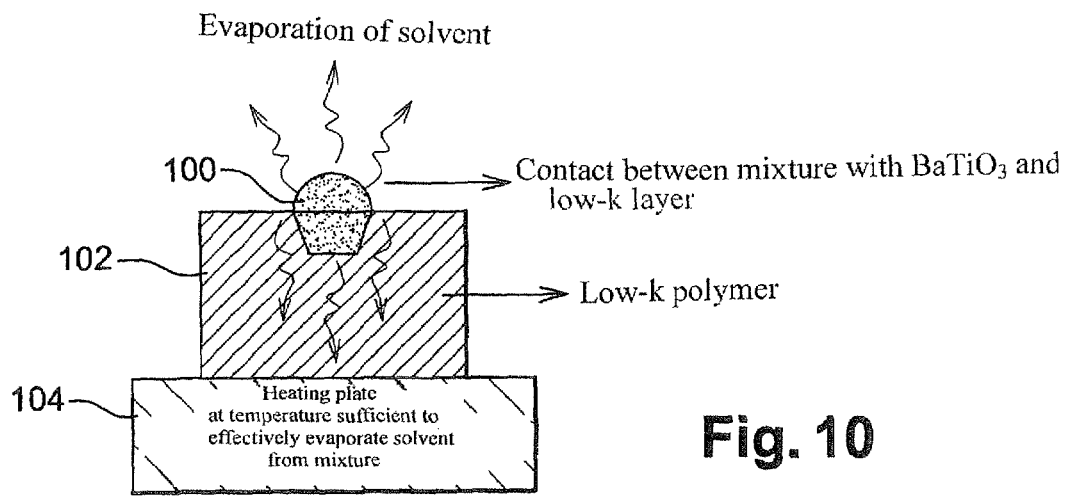
Figure 11:
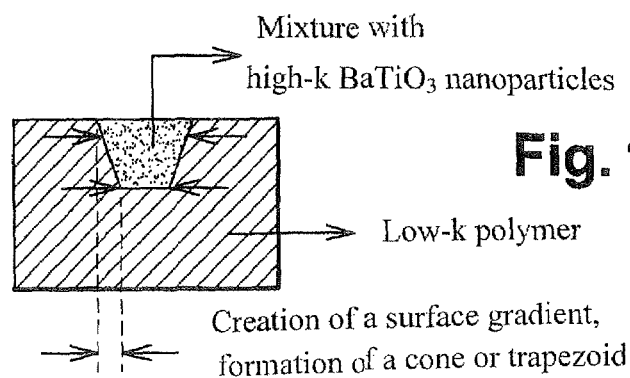

FIGS. 9 to 11 show a first method for fabricating a low-k dielectric layer in which there is a volume of high-k dielectric which has a tapering cross-section such as that used in a transistor according to the invention.

In the first step shown in FIG. 9, a drop 100 of a mixture of high-k dielectric nanoparticles such as nanoparticles of $BaTiO_3$, $Ta_2O_5$, $Al_2O_3$ or $TiO_2$ and solvent is deposited, by using an ink jet technique for example, on the surface of a low-k dielectric layer 102, more especially a low-k polymer such as a fluoropolymer such as polystyrene having a relative dielectric permittivity of 2 to 2.5.

As shown in FIG. 10, low-k polymer layer 102 is then heated, for example by using a heating plate 104 on which it stands, to a temperature which is sufficient to effectively evaporate the solvent from the deposited drop 100, for instance the evaporating temperature of the solvent. For example, using toluene as a solvent is tantamount to selecting a heating temperature of approximately 100° C.

A phenomenon whereby there is competitive evaporation of drop 100 and penetration of the latter into polymer 102 is then observed. Drop 100 thus dissolves partially into polymer 102 and forms a volume of high-k nanocharges dispersed in an organic matrix (in this case the low-k polymer) having a tapering cross-section like a cone or truncated cone (FIG. 11).

The choice of solvent and the choice of temperature make it possible, in particular, to adjust the depth to which the nanoparticles penetrate into the polymer and hence the final shape of the volume of high-k dielectric in the low-k dielectric layer.

According to a second method for fabricating a dielectric layer for an organic transistor in accordance with the invention, a layer of a first low-k dielectric material is cut, for example by chemical etching, laser abrasion, stamping or another method, in order to form a cavity in the latter having an overall tapering cross-section such as a cone for instance.

The cavity thus formed is then filled with a second material having a relative dielectric permittivity which is higher than that of the first material, such as a high-k dielectric or metal, filling being obtained, for instance, by dispersing a liquid or by deposition by spraying after masking those areas of the layer of the first material which are not to be modified.

We claim:

1. An organic transistor comprising:
    a conductive element which forms a drain;
    a conductive element which forms a source located away from the drain;
    a conductive element which forms a gate having a surface which faces the drain and a surface which faces the source;
    a semiconducting layer which is in contact with the drain and the source so as to produce a charge-carrier channel between the drain and the source;
    a dielectric layer covering the semiconducting layer, the dielectric layer comprising a first dielectric material having a dielectric permittivity of less than four and a volume of second dielectric material having a dielectric permittivity of greater than four,
    wherein the dielectric layer comprises three locational portions, a first portion located between opposite facing surfaces of the gate and the source, and a second portion located between opposite facing surfaces of the gate and the charge carrier channel, and a third portion located between opposite facing surfaces of the gate and the drain; and
    wherein said volume of second dielectric material has an overall cross-section which tapers from the gate towards the charge-carrier channel, and
    wherein said first portion of said dielectric layer and said third portion of said dielectric layer consist essentially of the first dielectric material, and
    wherein said second portion of said dielectric material consists essentially of the second dielectric material.

2. An organic transistor as claimed in claim 1, wherein the relative dielectric permittivity of the first dielectric material is equal to or less than two and the relative dielectric permittivity of the second dielectric material is equal to or greater than eight.

3. An organic transistor as claimed in claim 1, wherein said volume of said second dielectric material has a cross-section which tapers monotonically.

4. An organic transistor as claimed in claim 3, wherein said volume is a revolution volume, especially a conical or trapezoidal volume.

5. An organic transistor as claimed in claim 1, wherein the first dielectric material layer comprises a portion h of the first dielectric material above a space between drain and source.

6. An organic transistor as claimed in claim 5, wherein the thickness of the portion h of the first dielectric material is less than 400 nanometers.

7. An organic transistor as claimed in claim 1, wherein the second dielectric material is alumina.

8. An organic transistor as claimed in claim 1, wherein the second dielectric material comprises nanocharges having a relative dielectric permittivity greater than four dispersed in an organic matrix having a relative dielectric permittivity of less than four.

9. An organic transistor as claimed in claim 8, wherein the nanocharges have a relative dielectric permittivity in excess of 100.

10. An organic transistor as claimed in claim 8, wherein the nanocharges are nanoparticles selected from the group comprising $BaTiO_3$, $Ta_2O_5$, $Al_2O_3$ and $TiO_2$.

11. An organic transistor as claimed in claim 1, wherein the first dielectric material is a fluoropolymer or polystyrene.

* * * * *